US008850382B2

(12) United States Patent
Matsushita et al.

(10) Patent No.: US 8,850,382 B2
(45) Date of Patent: Sep. 30, 2014

(54) ANALYSIS APPARATUS AND METHOD TO ANALYZE A PRINTED CIRCUIT BOARD (75) Inventors: Hideharu Matsushita, Kawasaki (JP); Akira Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 826 days.

(21) Appl. No.: 12/628,336

(22) Filed: Dec. 1, 2009

(65) Prior Publication Data
US 2010/0138799 A1 Jun. 3, 2010

(30) Foreign Application Priority Data
Dec. 2, 2008 (JP) .................................. 2008-306978

(51) Int. Cl.
G06F 17/50 (2006.01)
G06F 11/22 (2006.01)
(52) U.S. Cl.
CPC .................................. *G06F 17/5081* (2013.01)
USPC ............................ 716/137; 716/136; 703/14
(58) Field of Classification Search
None
See application file for complete search history.

(56) References Cited

U.S. PATENT DOCUMENTS

| | | | | |
|---|---|---|---|---|
| 5,550,750 A | * | 8/1996 | Wolff | 716/112 |
| 6,662,345 B2 | * | 12/2003 | Uchida et al. | 716/111 |
| 7,472,363 B1 | * | 12/2008 | Chandra | 716/106 |
| 7,805,689 B2 | * | 9/2010 | Ueda et al. | 716/118 |
| 7,823,102 B2 | * | 10/2010 | Chandra et al. | 716/106 |
| 2008/0079146 A1 | | 4/2008 | Hattori et al. | |
| 2008/0082947 A1 | * | 4/2008 | Ueda et al. | 716/8 |
| 2009/0192971 A1 | * | 7/2009 | Ueda et al. | 706/48 |
| 2009/0193051 A1 | * | 7/2009 | Ueda et al. | 707/102 |
| 2010/0333059 A1 | * | 12/2010 | Tsujimura | 716/136 |

FOREIGN PATENT DOCUMENTS

| | | |
|---|---|---|
| JP | 9-230963 | 9/1997 |
| JP | 2006-91939 | 4/2006 |
| JP | 2008-90522 | 4/2008 |
| JP | 2008-91471 | 4/2008 |

\* cited by examiner

*Primary Examiner* — A. M. Thompson
(74) *Attorney, Agent, or Firm* — Staas & Halsey LLP (57) ABSTRACT

An analysis apparatus for a printed circuit board. The analysis apparatus includes a processor that executes a process of rewriting physical property data of a wiring layer of a printed circuit board to a value. The value is based on physical property data of an electronic part having a heat-generating attribute. The electronic part is mounted on the portion of the wiring layer. The analysis apparatus converts the physical property data of the portion of the wiring layer that has the electronic part to physical property data of an insulating layer of the printed circuit board.

6 Claims, 9 Drawing Sheets

Q1 : PART ARRANGED ON BOARD
SURFACE (PART SURFACE)

I1: THERMOGENIC PART WITHIN BOARD

FIG. 5C

I1 IS EMBEDDED IN WIRING LAYER

FIG. 5D

I2: APYROGENIC PART WITHIN BOARD

FIG. 5E

I2 IS DELETED

FIG. 5F

R1: PART ARRANGED ON BOARD SURFACE
(SOLDERING SURFACE)

FIG. 6A TOP VIEW

FIG. 6B SECTION VIEW

FIG. 6E TOP VIEW

FIG. 6F SECTION VIEW

FIG. 6C

PART INFORMATION/SHAPE

FIG. 6D

|  | BEFORE CHANGE | AFTER CHANGE |
|---|---|---|
| ARRANGED POSITION | A(x1, y1, Zu) | A(x1, y1, Zd) |
|  | B(x2, y1, Zu) | B(x2, y1, Zd) |
|  | C(x2, y2, Zu) | C(x2, y2, Zd) |
|  | D(x1, y2, Zu) | D(x1, y2, Zd) |
|  | E(x1, y1, Zo) | E(x1, y1, Zu) |
|  | F(x2, y1, Zo) | F(x2, y1, Zu) |
|  | G(x2, y2, Zo) | G(x2, y2, Zu) |
|  | H(x1, y2, Zo) | H(x1, y2, Zu) |
| HEATING VALUE | 2 [W] | SAME AS LEFT |
| PHYSICAL PROPERTY VALUE HEAT CAPACITY | J | CHANGE WITH CHANGE IN SHAPE (J1) |
| THERMAL CONDUCTIVITY | λ | CHANGE WITH CHANGE IN SHAPE (λ1) |

PHYSICAL PROPERTY VALUES OF PART
DENSITY [kg/m3]
SPECIFIC HEAT [kJ/(kg·°C)]
THERMAL CONDUCTIVITY [W/(m·°C)]

FIG. 7A

| | X (mm) | Y (mm) | Z (HEIGHT) (mm) | VOLUME (m³) |
|---|---|---|---|---|
| PART | 5 | 5 | 0.4 | 1E-08 |
| WIRING LAYER | 5 | 5 | 0.18 | 4.5E-09 |

FIG. 7B

| MATERIAL NAME | DENSITY | SPECIFIC HEAT | THERMAL CONDUCTIVITY |
|---|---|---|---|
| PART | 1800 | 1.1 | 0.3 |
| WIRING LAYER | 8800 | 386 | 398 |

FIG. 7C

| CONFIGURATION | THICKNESS | INTEGRATED THICKNESS | THICKNESS RATIO |
|---|---|---|---|
| PART | 0.4 | 0.58 | 0.69 |
| WIRING LAYER | 0.18 | | 0.31 |

FIG. 7D

| CONFIGURATION | VOLUME | INTEGRATED VOLUME | VOLUME RATIO |
|---|---|---|---|
| PART | 1E-08 | 1.45E-08 | 0.69 |
| WIRING LAYER | 4.5E-09 | | 0.31 |

- EXPRESSIONS GIVING VOLUME RATIO
  (DENSITY AND SPECIFIC HEAT)

$$\rho = \Sigma \rho_i (V_i/V)$$     3970

$$C = \Sigma c_i (V_i/V)$$     120.42

- EXPRESSION GIVING HEIGHT RATIO
  (THERMAL CONDUCTIVITY)

$$\lambda = \left[ \Sigma (1/\lambda_i)(\Delta z_i/\Delta z) \right]^{-1}$$     0.43

ANALYSIS APPARATUS AND METHOD TO ANALYZE A PRINTED CIRCUIT BOARD

This application is related to and claims priority to Japanese Patent Application No. 2008-306978, filed on Dec. 2, 2008, and incorporated herein by reference.

FIELD

The embodiments discussed herein are related to an analysis apparatus.

BACKGROUND

In order to improve the analysis precision for thermal analysis on a printed circuit board, refined heat dissipation paths are important. Particularly, a printed circuit board having active parts (or heat-generating parts) within the board has most heat dissipation paths extending on the board surface and through an internal solid layer. Thermal modeling in consideration of heaters, wires, and VIAs within the board may be required.

In the prior art, analysis modeling has been performed by capturing parts (heat-generating or non-heat-generating), a layer configuration, wiring information, and VIA shapes from a printed circuit board CAD system through a CAD intermediate file. In order to reduce the scale of the analysis and for simplification, non-heat-generating elements have been modeled as follows:

Wiring pattern (in the horizontal direction): defined with an equivalent heat transfer rate on the basis of the wiring ratio of copper (Cu);

VIA (in the vertical direction): defined with an anisotropic heat transfer rate; and Internal parts: defined with an equivalent thermal conductivity of a part.

The related prior arts are disclosed in the following documents:
[Patent Document 1]
Japanese Laid-open Patent Publication No. 9-230963
[Patent Document 2]
Japanese Laid-open Patent Publication No. 2006-91939
[Patent Document 3]
Japanese Laid-open Patent Publication No. 2008-91471

SUMMARY

According to an embodiment, an analysis apparatus for a printed circuit board includes an acquiring portion that acquires printed circuit board model data on a printed circuit board having electronic parts in an external wiring layer and an internal wiring layer and having an insulating layer between the wiring layers; an extracting portion that extracts, from the printed circuit board model data, the electronic part data corresponding to an electronic part mounted in the internal wiring layer and having a heat-generating attribute among the electronic parts; a converting portion that rewrites physical property data of the wiring layer in contact with a mounting surface having the part corresponding to the extracted electronic part data to a value based on the physical property data of the electronic part, and converts the physical property data of a region having the electronic part corresponding to the electronic part data extracted by the extracting portion to the physical property data of the insulating layer; and an analysis portion that uses the printed circuit board model data converted by the converting portion to perform thermal analysis processing.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The detailed modeling on board information on a printed circuit board greatly increases the scale of an analysis model and increases the calculation time. Defining an equivalent thermal conductivity or anisotropic thermal conductivity may reduce the scale of a model and reduce the calculation time, but the heat dissipation paths are simplified, which may disadvantageously reduce the analysis precision. Particularly, since parts (or heat-generating parts) arranged within a board have heat dissipation paths only through heat conduction, accurate modeling may be required. A lower precision of modeling may lower the effect of the countermeasure against heat (with a heat sink, for example) of the parts (or heat-generating parts) on the board surface.

A printed circuit board analysis apparatus according to an embodiment of the invention simplifies internal electronic parts in printed circuit board model data so that the precision may be maintained and at the same time the processing time for thermal analysis may be reduced.

Figure 1:
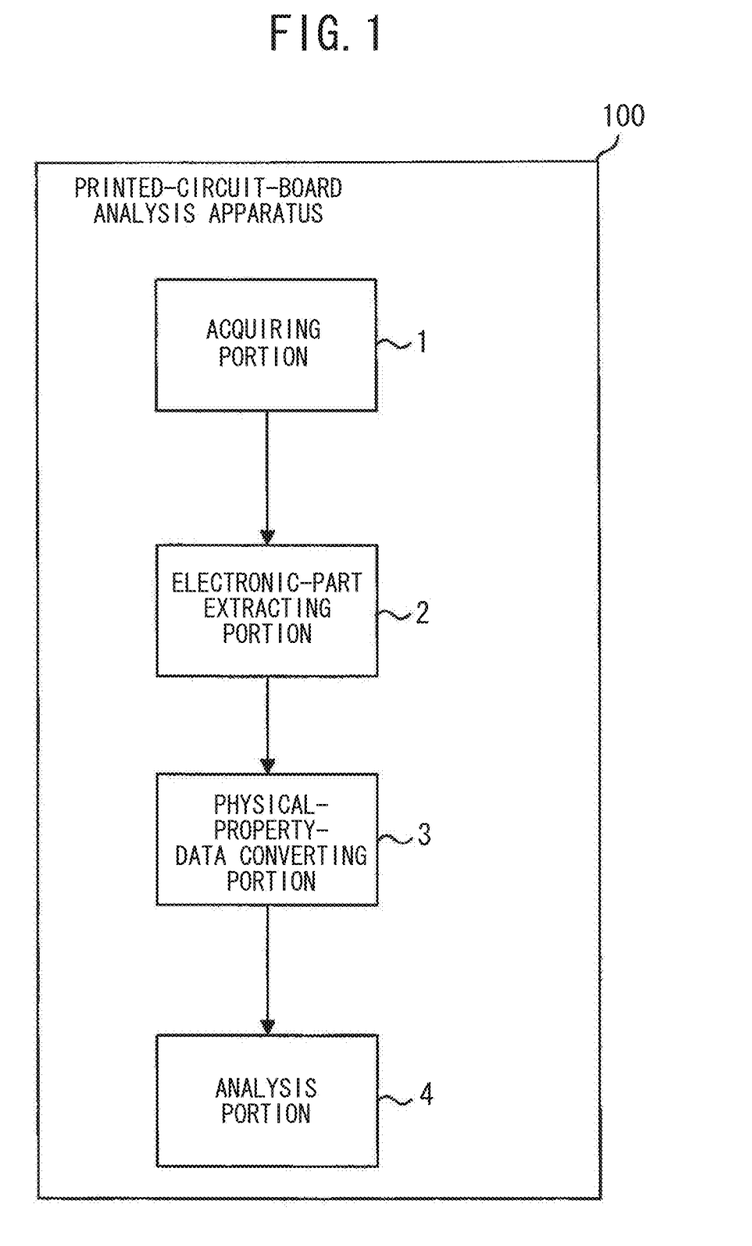
FIG. 1 is a diagram illustrating a function configuration of a printed circuit board analysis apparatus according to an embodiment.

FIG. 1 illustrates function blocks of a printed circuit board analysis apparatus of this embodiment. A printed circuit board analysis apparatus 100 includes an acquiring portion 1, an electronic-part extracting portion 2 (which may be an extracting portion or a second extracting portion), a physical-property-data converting portion 3 (which may be a converting portion or a second converting portion), and an analysis portion 4.

The acquiring portion 1 acquires printed circuit board model data from a printed-circuit-board design database. The printed circuit board model data is board information on a printed circuit board having electronic parts at least on an external wiring layer and an internal wiring layer, and having an insulating layer between the wiring layers.

The electronic-part extracting portion 2 extracts information on an electronic part mounted on an internal wiring layer and having a heat-generating attribute (which will be called "internal heat-generating part" hereinafter) among the electronic parts from the printed circuit board model data acquired by the acquiring portion 1. The electronic-part extracting portion 2 further extracts information on an electronic part mounted on an internal wiring layer and having a non-heat-generating attribute (which will be called "internal non-heat-generating part" hereinafter) among the electronic parts from the printed circuit board model data acquired by the acquiring portion 1.

Based on the printed circuit board model data, the physical-property-data converting portion 3 rewrites the physical property data of the wiring layer in contact with the mounting surface having the extracted internal heat-generating part to the value based on the physical property data of the internal heat-generating electronic part and thus converts the physical property data of the region having the internal heat-generating electronic part to the physical property data of the insulating layer. The physical-property-data converting portion 3 further converts the physical property data of the region having the extracted internal non-heat-generating electronic part to the physical property data of the insulating layer on the printed circuit board model data.

The analysis portion 4 uses the printed circuit board model data converted by the physical-property-data converting portion 3 to perform thermal analysis processing. Notably, the analysis portion 4 performs wiring-layer simplifying processing and VIA simplifying processing before performing the analysis. The wiring-layer simplifying processing and VIA simplifying processing may be processing disclosed in Japanese Laid-open Patent Publication No. 2008-90522.

Figure 2:
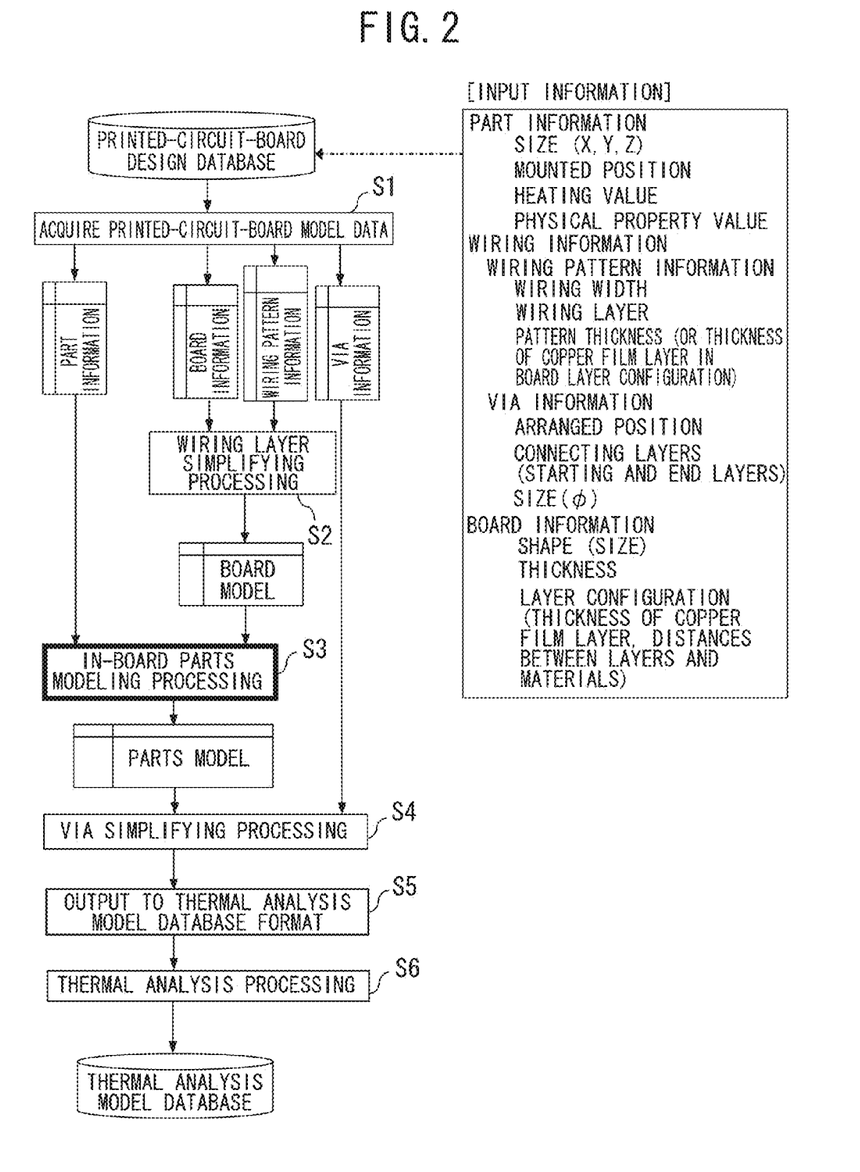
FIG. 2 is a flowchart illustrating an example of the basic processing flow by the printed circuit board analysis apparatus according to the embodiment.

Next, information of printed circuit board model data held in the printed-circuit-board design database and operations by the printed circuit board analysis apparatus 100 will be described with reference to FIG. 2.

First of all, the information held within the printed-circuit-board design database will be described. The printed-circuit-board design database holds printed circuit board model data to be analyzed, including part information, wiring information, and board information. The part information includes information on the size of the part, the mounted position on the printed circuit board, the heating value exhibited by the electronic part, and a physical property value of the part. The wiring information includes wiring pattern information including information on a wiring width, a wiring layer, and a pattern thickness (which is the thickness of a copper film layer in the board layer configuration), and VIA information including information on the arranged position, connecting layers (including the starting layer and the end layer) and the size ($\phi$). The board information includes information on the shape (size) of the board, the thickness of the board, and the layer configuration (including the thickness of a copper film layer, distances between layers, and materials).

According to this embodiment, the printed-circuit-board design database is provided within an external system. The printed circuit board analysis apparatus 100 acquires information as required. Notably, the printed-circuit-board design database may be provided within the printed circuit board analysis apparatus 100.

Next, operations by the printed circuit board analysis apparatus 100 will be described.

The acquiring portion 1 acquires the printed circuit board model data, that is, the part information, wiring information, board information from the printed-circuit-board design database (S1).

The analysis portion 4 extracts the board information and wiring pattern information and uses the extracted data to perform the wiring-layer simplifying processing. Thus, the analysis portion 4 creates the printed circuit board model data as a board model (S2). Notably, according to this embodiment, the wiring-layer simplifying processing may be the processing disclosed in Japanese Laid-open Patent Publication No. 2008-90522.

Next, the electronic-part extracting portion 2 extracts part information from the printed circuit board model data. The board model having undergone the wiring-layer simplifying processing further undergoes in-board parts modeling processing based on the extracted part information. Thus, the parts model is created (S3). The details of the in-board parts modeling processing will be described later.

Next, the analysis portion 4 extracts VIA information from the printed circuit board model data and acquires the created parts model. After that, the analysis portion 4 uses the VIA information to perform VIA simplifying processing (such as the processing disclosed in Japanese Laid-open Patent Publication No. 2008-90522) on the parts model and thus creates the thermal analysis model (S4). Then, the analysis portion 4 outputs the thermal analysis model to the thermal analysis model database (S5).

The analysis portion 4 performs thermal analysis processing on the thermal analysis model held in the thermal analysis model database (S6). Notably, the thermal analysis processing is similar to the processing having been performed in the prior art.

The printed circuit board analysis apparatus 100 may skip the processing in steps S2 and S4. In that case, the acquiring portion 1 acquires the printed circuit board model data (S1) and performs the in-board parts modeling processing on the acquired printed circuit board model data (S3). After that, the printed circuit board model data having undergone the in-board parts modeling processing undergoes the thermal analysis processing by the analysis portion 4 (S6).

Next, the in-board parts modeling processing in S3 will be described with reference to the flowchart in FIG. 3.

The electronic-part extracting portion 2 first extracts part information from the printed circuit board model data (S10). The electronic-part extracting portion 2 determines whether the extracted part information is on a part arranged within the board or not based on the mounted position within the part information (S11). If it is on an in-board part (S11: Yes), the electronic-part extracting portion 2 next determines whether the heating value within the part information is higher than 0 or not (that is, whether it is a heat-generating part or not) (S12).

If the electronic part is a heat-generating part (S12: Yes), the physical-property-data converting portion 3 performs the following processing (S13):

The physical-property-data converting portion 3 converts the height of the electronic part to the thickness of the wiring layer. In other words, the physical-property-data converting portion 3 converts the height component of the size defined within the part information to the pattern thickness within the wiring information.

The physical-property-data converting portion 3 moves the electronic part, whose height has been changed to the thickness of the wiring layer, in the direction of the wiring layer by an amount of the thickness of the arranged wiring layer and embeds the electronic part in the wiring layer. In other words, the physical-property-data converting portion 3 changes the mounted position in the part information to the position of the wiring layer (assuming that the position of the wiring layer is predefined).

The physical-property-data converting portion 3 changes the physical property value of the electronic part embedded in the wiring layer to the physical property value according to the change in shape and further changes the physical property value of the region having had the electronic part to a value predefined as the physical property value of the insulating layer.

The physical-property-data converting portion 3 registers the data changed by the processing above with the parts model table (S14).

On the other hand, if the electronic part is not a heat-generating part, that is, if it is an internal non-heat-generating electronic part (S12: No), the physical-property-data converting portion 3 changes the physical property value of the region having the extracted internal non-heat-generating electronic part to the physical property value of the insulating layer (S15) to handle the internal non-heat-generating electronic part as being not present (or to use it as a dummy) and registers the changed data with the parts model table (S14). Notably, the physical-property-data converting portion 3 may not change the physical property value of the internal non-heat-generating electronic part to the physical property value of the insulating layer and may not register the internal non-heat-generating electronic part with the parts model table. In this way, handling the internal non-heat-generating electronic part as not being present may provide the same effect as that of the processing in steps S15 and S14.

If the electronic part is not a part arranged within the board (S11: No), the electronic part is registered as is with the parts model table (S14).

The processing is repeated a number of times equal to the number of the electronic parts.

Next, how the processing illustrated in the flowchart illustrated in FIG. 3 changes an electronic part within the board will be described with reference to FIGS. 4A and 4B and FIGS. 5A to 5H.

Figure 4A:
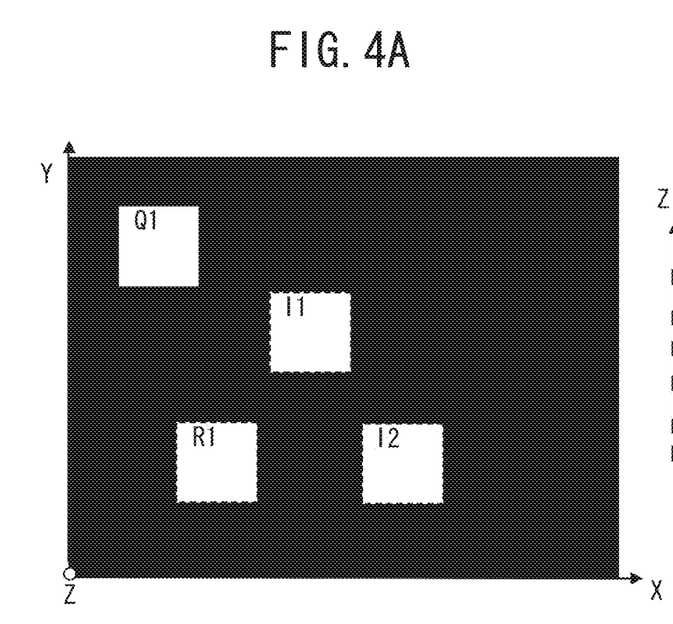
FIGS. 4A and 4B are diagrams illustrating examples of the printed circuit board to be verified according to the embodiment.
Figure 4B:
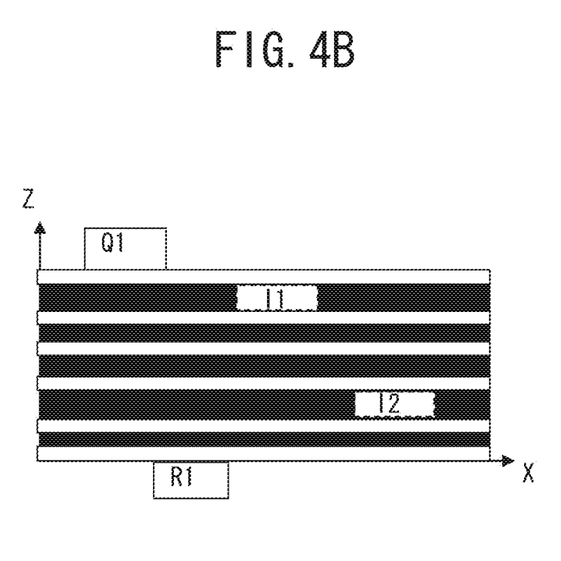

First of all, an example of the printed circuit board to be processed is illustrated in the plan view in FIG. 4A and the section view in FIG. 4B. FIGS. 4A and 4B include an electronic part Q1 arranged on a board surface (parts surface) and an electronic part R1 arranged on a board surface (soldering surface). FIGS. 4A and 4B further include an electronic part I1, which is arranged within the board and is a heat-generating part, and an electronic part I2, which is arranged within the board and is a non-heat-generating electronic part.

Figure 3:
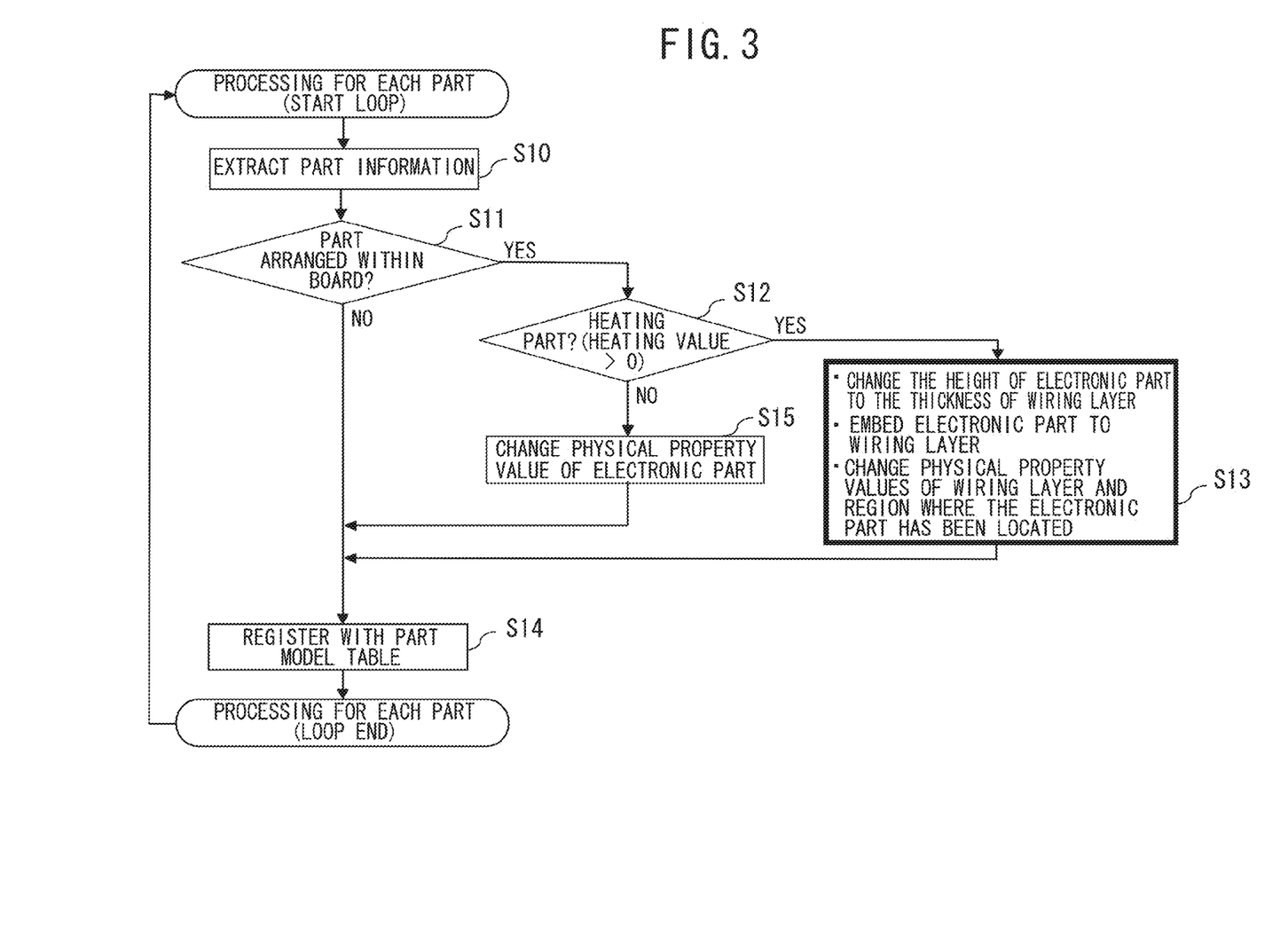
FIG. 3 is a flowchart illustrating an example of modeling processing on an in-board part by the printed circuit board analysis apparatus according to the embodiment.

The printed circuit board under the processing in the flowchart in FIG. 3 in order of Q1, I1, I2, and R1 exhibits the transitions in the printed circuit board illustrated in FIGS. 5A to 5H.

First of all, since the electronic part Q1 is registered as is with the parts model table (S11: No to S14), nothing changes in the data. (Refer to the plan view in FIG. 5A and the section view in FIG. 5B). The electronic part I1 undergoes the processing in S13, whereby the electronic part I1 is embedded in the wiring layer. (Refer to the plan view in FIG. 5C and the section view in FIG. 5D).

Next, since the electronic part I2 has the physical property value changed to the physical property value of the insulating layer (S15), the data itself is deleted. (Refer to the plan view in FIG. 5E and the section view in FIG. 5F). Since the electronic part R1 is registered as is with the parts model table, like the electronic part Q1, (S11: No to S14), nothing changes in the data. (Refer to the plan view in FIG. 5G and the section view in FIG. 5H).

Figure 5A:
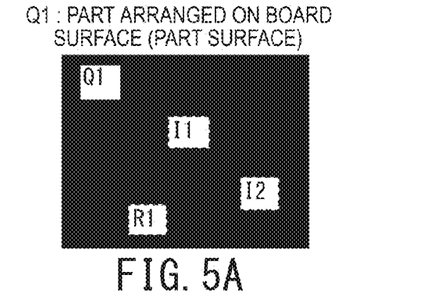
FIGS. 5A to 5H are diagrams illustrating examples of modeling processing on in-board parts by the printed circuit board analysis apparatus according to the embodiment.
Figure 5B:
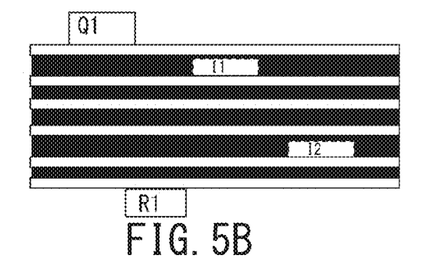
Figure 5C:
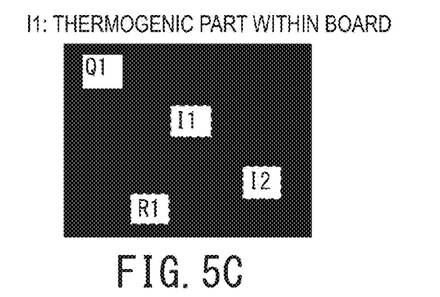
Figure 5D:
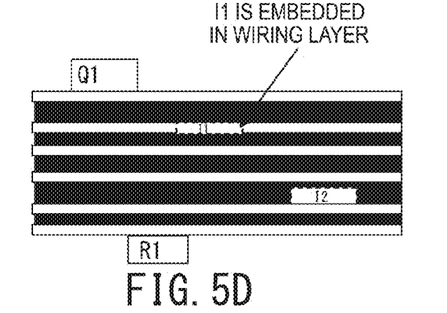
Figure 5E:
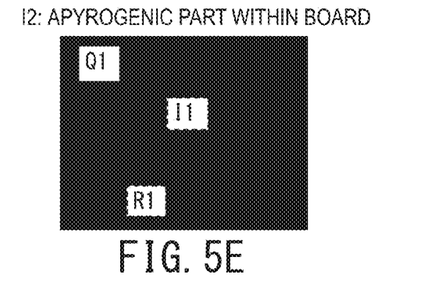
Figure 5F:
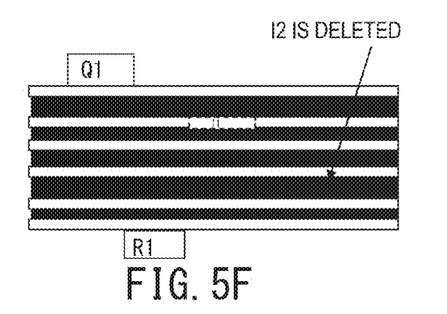
Figure 5G:
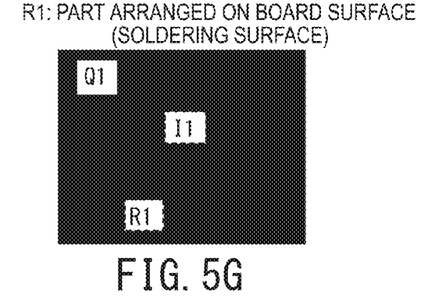
Figure 5H:
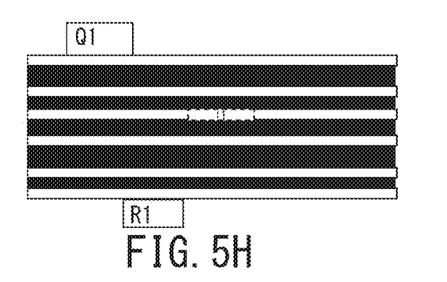

The electronic-part extracting portion 2 and physical-property-data converting portion 3 change the printed circuit board model data illustrated in FIGS. 4A and 4B to the configuration data illustrated in the plan view in FIG. 5G and the section view in FIG. 5H. The configuration data undergoes the thermal analysis processing as in the prior art by the analysis portion 4.

Figure 6A:
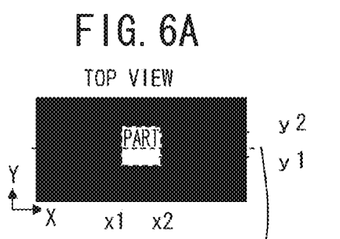
FIGS. 6A to 6F are diagrams illustrating examples of embedding modeling processing on a heat-generating part by the printed circuit board analysis apparatus according to the embodiment.
Figure 6B:
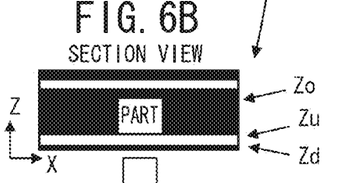
Figure 6C:
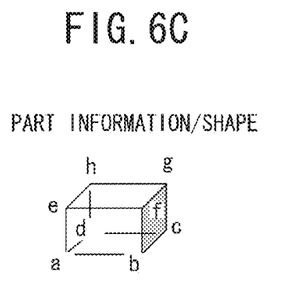
Figure 6D:
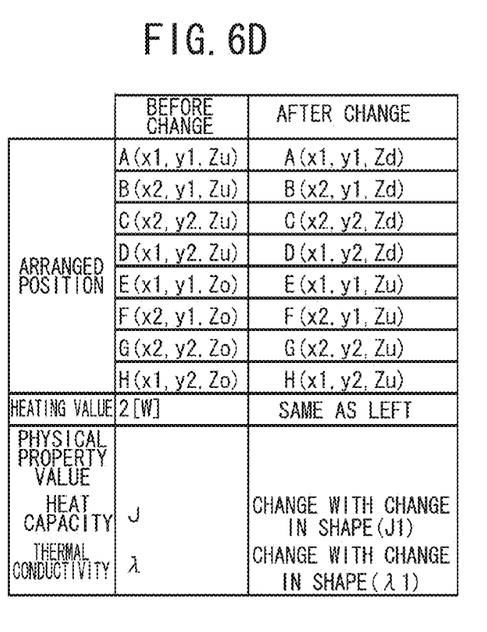

Next, the details of the electronic-part embedding processing in S13 will be described with reference to FIGS. 6A to 6F. FIG. 6A illustrates a plan view of the printed circuit board, and FIG. 6B illustrates a section view thereof. FIG. 6C illustrates the shape of an internal heat-generating part. Notably, the coordinates (at the arranged position) of the apexes, heating value and physical property value of the internal heat-generating part are as illustrated under the heading "BEFORE CHANGE" in FIG. 6D.

Figure 6E:
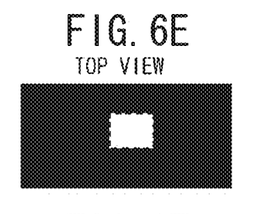
Figure 6F:
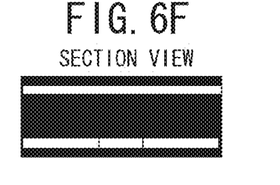

The processing in S13 performed by the physical-property-data converting portion 3 converts the position of the internal heat-generating part to the position illustrated in the plan view in FIG. 6E and the section view in FIG. 6F. The physical property value of the position-converted electronic part is converted to the value based on the physical property value of the electronic part (such as the value based on the change in shape of the electronic part). Even after the conversion processing by the physical-property-data converting portion 3, the heating value of the electronic part does not change. (Refer to the column under the heading "AFTER CHANGE" in FIG. 6D).

Now, a method for calculating the physical property value will be described. The physical-property-data converting portion 3 of this embodiment calculates the density $\rho$ (kg/m$^3$) and specific heat C (kJ/(kg·° C.)) as a heat capacity and calculates the value of the thermal conductivity (W/(m·° C.)).

Figure 7A:
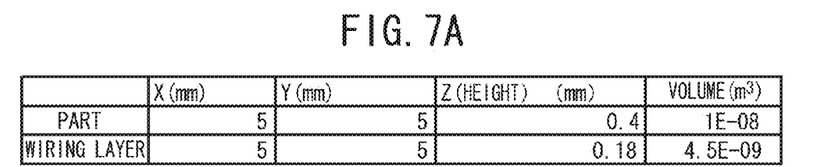
FIGS. 7A to 7D are diagrams illustrating examples of a method for calculating a physical property value.
Figure 7B:
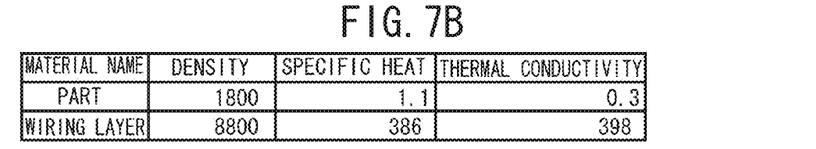
Figure 7C:
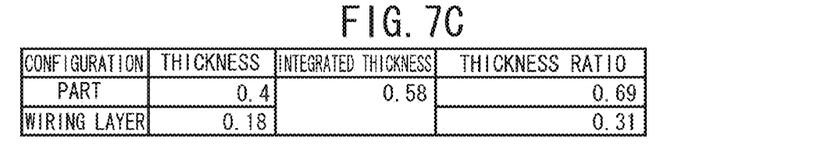
Figure 7D:
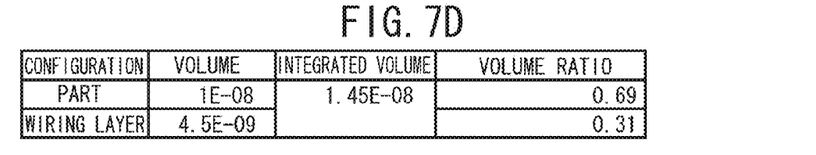

With reference to FIGS. 7A to 7D illustrating part and wiring-layer examples, a method for calculating the physical property values will be described. Examples of the dimensions of the part and the dimensions of the wiring layer are illustrated in FIG. 7A. The densities, specific heats and thermal conductivities of the part and wiring layer are illustrated in FIG. 7B. The thickness ratios (thickness/integrated thickness) of the part and wiring layer based on the dimensions in FIG. 7A are illustrated in FIG. 7C. The volume ratios (volume/integrated volume) of the part and wiring layer based on the dimensions in FIG. 7A are illustrated in FIG. 7D.

For calculating, the physical property data converting portion 3 of this embodiment handles:

the density as $\rho = \Sigma \rho i\ (Vi/V)$;

the specific heat as $C = \Sigma Ci(Vi/V)$; and the thermal conductivity as $\lambda = 1/\{\Sigma((1/\lambda i)(\Delta Zi/\Delta Z))\}$ (where V: volume and Z: height). Applying the expressions to the examples illustrated in FIGS. 7A to 7D, the physical property values are calculated as:

the density $\rho = 1800 \times 0.69 + 8800 \times 0.31 = 3970$;

the specific heat $C = 1.1*0.69 + 386*0.31 = 120.55$; and the thermal conductivity $\lambda = 1/((1/0.3)*0.69 + (1/398)*0.31) = 0.43$.

The physical property values are calculated before the shape of the part is changed. The physical property values (or equivalents) of the wiring layer having the part are calculated in order to specify the size of the part, virtually handle the part as a double-layer structure and converting the part to a single layer structure.

Finally, actual measurement data will be used to compare a method in the prior art and the method of this embodiment, and effects produced by this embodiment will be described.

For example, when a printed circuit board having a board size equal to 37 mm×35 mm and eight layers had a mesh spacing 0.3 mm, which is 5 mm for each layer, the method in the prior art resulted in 663556 internal parts while the method using the printed circuit board analysis apparatus 100 of this embodiment resulted in 575556 (which is a decrease by approximately 13%). Since the analysis time is proportional to three times of the number of meshes based on an empirical rule, the use of the printed circuit board analysis apparatus 100 may reduce the processing time by 39%. On the other hand, the analysis precision may be kept to within 5% or lower (as a result of the comparison based on measurements) at the peak temperature of the parts surface.

Figure 8:
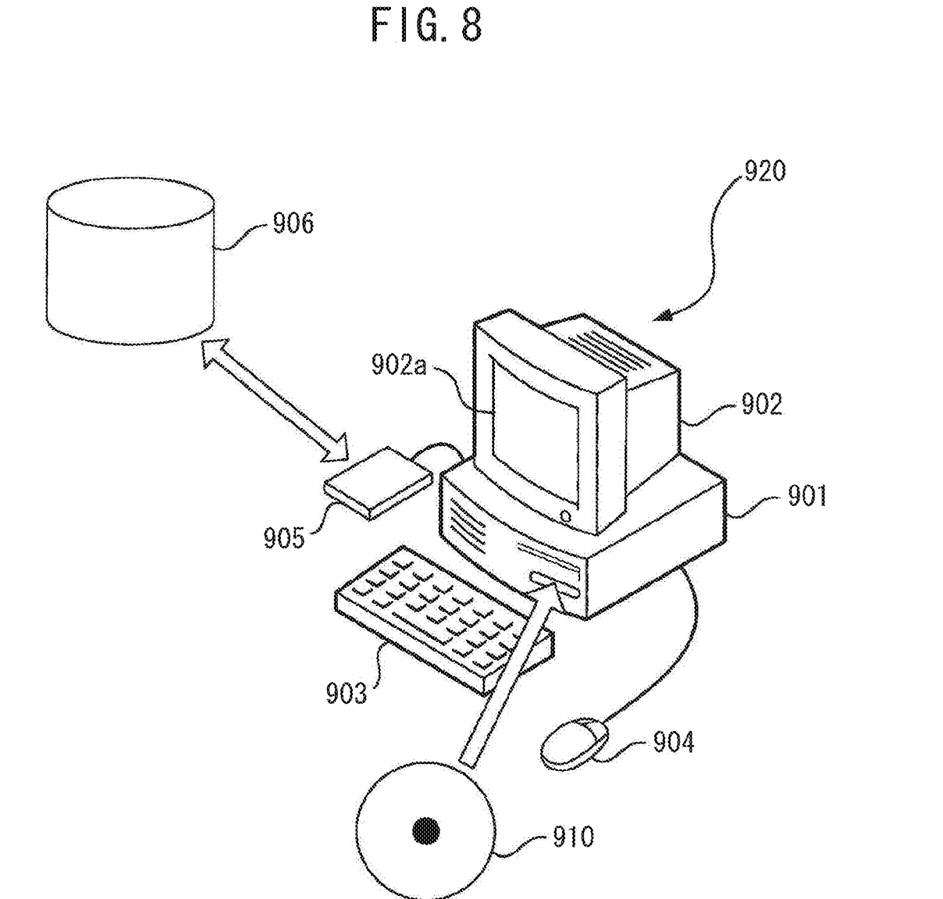
FIG. 8 is a diagram illustrating an example of a computer system applicable to the embodiment.

The invention is applicable in computer systems as will be described below. FIG. 8 is a diagram illustrating an example of computer systems to which the invention is applicable. A computer system 920 illustrated in FIG. 8 has a main unit 901 including a CPU and a disk drive, a display 902 that displays an image in accordance with an instruction from the main unit 901, a keyboard 903 for inputting various information to the computer system 920, a mouse 904 for designating an arbitrary position on a display screen 902a of the display 902 and a communication apparatus 905 that accesses an external database, for example, and downloads a program stored in another computer system. The communication apparatus 905 may be a network communication card or a modem, for example.

The program causing performance of the steps in the computer system implementing the printed circuit board analysis apparatus as described above may be provided as a printed circuit board analysis program. The program may be stored in a recording medium that is readable by the computer system so that the program may be executed by the computer system implementing the printed circuit board analysis apparatus. The program for performing the steps may be stored in a portable recording medium such as a disk 910 or may be downloaded from a recording medium 906 in another computer system through the communication apparatus 905. The printed circuit board analysis program (or printed circuit board analysis software) providing the computer system 920 with at least a printed circuit board analysis function may be input to the computer system 920 and be compiled. The program causes the computer system 920 to operate as the printed circuit board analysis apparatus having the printed circuit board analysis function. The program may be stored in a computer-readable recording medium such as the disk 910. The recording media readable by the computer system 920 may include an internal storage device internally mounted in a computer, such as a ROM and a RAM, a portable storage medium such as the disk 910, a flexible disk, a DVD, a magneto-optical disk, and an IC card, a database holding a computer program, another computer system and its database, and a recording medium accessible by a computer system connecting thereto through a communication unit such as the communication apparatus 905.

Figure 9:
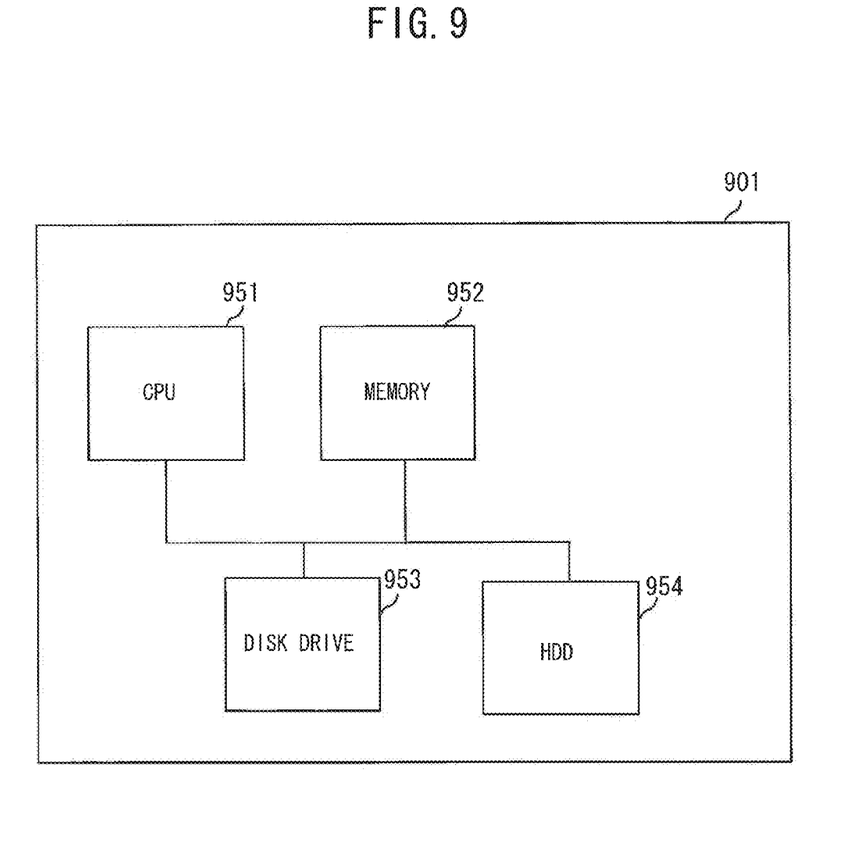
FIG. 9 is a diagram illustrating an example of a hardware configuration of the body of a computer system applicable to the embodiment.

FIG. 9 is a diagram illustrating an example of the hardware configuration of the main unit 901 in the computer system 920. The main unit 901 includes a CPU (central processing unit) 951, a memory 952, a disk drive 953 that reads and writes data from and to a portable recording medium such as the disk 910 and an HDD (hard disk drive) 954, which is a non-volatile storage unit. These units may be implemented by the program pre-stored within a non-volatile storage unit such as the HDD 954 and the disk 910 in collaboration with a hardware resource such as the CPU 951 and the memory 952.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the of the invention.

The invention claimed is:

1. An analysis apparatus for a printed circuit board comprising:
    a memory that stores printed circuit board model data of the printed circuit board including electronic parts on wiring layers having an external wiring layer and an internal wiring layer, and including an insulating layer between the wiring layers; and
    a processor that executes a process including:
        acquiring the printed circuit board model data;
        extracting, from the printed circuit board model data, electronic part data corresponding to a first electronic part mounted on the internal wiring layer and having a heat-generating attribute among the electronic parts;
        rewriting physical property data of a portion of the wiring layers to a value based on physical property data of the first electronic part, the portion of the wiring layers being in contact with the first electronic part;
        converting the physical property data of a portion of the wiring layers which the first electronic part occupies to physical property data of the insulating layer;
        changing the printed circuit board model data based on the converting; and
        performing a thermal analysis processing using the changed printed circuit board model data.

2. The analysis apparatus according to claim 1, the process including:
    extracting, from the printed circuit board model data, electronic part data corresponding to a second electronic part mounted on the internal wiring layer, the second electronic part being a non-heat generating electronic part, among the electronic parts; and
    converting physical property data of a portion of the wiring layers which the second electronic part occupies to the physical property data of the insulating layer.

3. An analysis method for a printed circuit board comprising:
    acquiring, using a processor, printed circuit board model data of the printed circuit board, the printed circuit board including electronic parts on wiring layers having an external wiring layer and an internal wiring layer, and including an insulating layer between the wiring layers;
    extracting, from the printed circuit board model data, electronic part data corresponding to a first electronic part mounted on the internal wiring layer and having a heat-generating attribute among the electronic parts;
    rewriting physical property data of a portion of the wiring layers to a value based on physical property data of the first electronic part, the portion of the wiring layers being in contact with the first electronic part;
    converting the physical property data of a portion of the wiring layers which the first electronic part occupies to physical property data of the insulating layer;

changing the printed circuit board model data based on the converting; and performing thermal analysis using the changed printed circuit board model data.

4. The analysis method according to claim 3, comprising:

extracting, from the printed circuit board model data, electronic part data corresponding to a second electronic part mounted on the internal wiring layer, the second electronic part being a non-heat generating electronic part, among the electronic parts; and converting physical property data of a portion of the wiring layers which the second electronic part occupies to the physical property data of the insulating layer.

5. A computer-readable recording medium encoded with a computer program that causes a computer system to execute a process of analysis for a printed circuit board, the process comprising:

acquiring printed circuit board model data of a printed circuit board including electronic parts on wiring layers having an external wiring layer and an internal wiring layer, and including an insulating layer between the wiring layers;

extracting, from the printed circuit board model data, electronic part data corresponding to a first electronic part mounted on the internal wiring layer and having a heat-generating attribute among the electronic parts;

rewriting physical property data of a portion of the wiring layers to a value based on physical property data of the first electronic part, the portion of the wiring layers in contact with the first electronic part;

converting physical property data of a portion of the wiring layers which the first electronic part occupies to physical property data of the insulating layer;

changing the printed circuit board model data based on the converting; and performing thermal analysis using the changed printed circuit board model data.

6. The computer-readable recording medium according to claim 5 comprising:

extracting, from the printed circuit board model data, electronic part data corresponding to second electronic part mounted on the internal wiring layer, the second electronic part being a non-heat generating electronic part, among the electronic parts; and converting physical property data of the portion of the wiring layers which the second electronic part occupies to the physical property data of the insulating layer.

* * * * *